United States Patent

Ho et al.

(10) Patent No.: US 6,645,851 B1
(45) Date of Patent: Nov. 11, 2003

(54) METHOD OF FORMING PLANARIZED COATINGS ON CONTACT HOLE PATTERNS OF VARIOUS DUTY RATIOS

(75) Inventors: Chia-Tung Ho, Taipei (TW); Feng-Jia Shih, Hsinchu (TW); Jieh-Jang Chen, Hsinchu (TW); Ching-Sen Kuo, Taipei (TW); Shih-Chi Fu, Taipei (TW); Gwo-Yuh Shiau, Hsichu (TW); Chia-Shiung Tsia, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/245,429

(22) Filed: Sep. 17, 2002

(51) Int. Cl.$^7$ .......................................... H01L 21/4763
(52) U.S. Cl. ...................... 438/626; 438/645; 438/740
(58) Field of Search ................................ 438/626, 631, 438/637, 639, 645, 740, 632, 638, 646

(56) References Cited

U.S. PATENT DOCUMENTS

| | | | |
|---|---|---|---|
| 5,077,234 A | 12/1991 | Scoopo et al. | 437/67 |
| 5,618,751 A | 4/1997 | Golden et al. | 438/392 |
| 5,958,800 A * | 9/1999 | Yu et al. | |
| 6,008,105 A | 12/1999 | Ukeda et al. | 438/424 |
| 6,121,158 A * | 9/2000 | Benchikha et al. | |
| 6,218,196 B1 | 4/2001 | Ise et al. | 436/689 |

* cited by examiner

*Primary Examiner*—Phuc T. Dang
(74) *Attorney, Agent, or Firm*—George O. Saile; Stephen B. Ackerman

(57) ABSTRACT

A method of forming a planarized photoresist coating on a substrate having holes with different duty ratios is described. A first photoresist preferably comprised of a Novolac resin and a diazonaphthoquinone photoactive compound is coated on a substrate and baked at or slightly above its Tg so that it reflows and fills the holes. The photoresist is exposed without a mask at a dose that allows the developer to thin the photoresist to a recessed depth within the holes. After the photoresist is hardened with a 250° C. bake, a second photoresist is coated on the substrate to form a planarized film with a thickness variation of less than 50 Angstroms between low and high duty ratio hole regions. One application is where the second photoresist is used to form a trench pattern in a via first dual damascene method. Secondly, the method is useful in fabricating MIM capacitors.

38 Claims, 5 Drawing Sheets

METHOD OF FORMING PLANARIZED COATINGS ON CONTACT HOLE PATTERNS OF VARIOUS DUTY RATIOS

FIELD OF THE INVENTION

The invention relates to the field of fabricating semiconductor devices and other electronic devices and in particular to a planarization method used for the formation of semiconductor devices.

BACKGROUND OF THE INVENTION

The manufacture of integrated circuits in a semiconductor device involves the sequential deposition of layers in which patterns are formed. A pattern is first formed by a lithography process in a photoresist layer and is subsequently transferred into one or more layers in a substrate by an etching method. Alternately, the photoresist pattern can serve as a mask for an ion implant step. In either case, an important requirement of the photoresist layer is forming a planar surface in order to afford a large process latitude for the patterning step.

Often the substrate upon which the photoresist is spin coated is not planar because it may be comprised of a pattern containing features such as lines that protrude above the surface of the substrate. Other substrates may have a largely level surface except for contact holes or trenches that are etched below the surface. The topography of non-planar substrates can involve thickness variations as large as 1 micron or more. However, even substrate thickness differences of only 0.1 to 0.2 microns can be significant when considering that photoresist film thickness is becoming thinner as feature size decreases. For advanced technology nodes where the critical dimension of a line width or space width is less than 200 nm, most photoresist layers are in the range of about 2000 to 8000 Angstroms (0.2 to 0.8 micron) thick. A photoresist composition normally includes an organic solvent, a photosensitive compound, and a polymer that has a low molecular weight which flows easily and tends to planarize readily on relatively smooth surfaces. However, when the topography includes steps with a height that is more than about 10 to 20% of the photoresist film thickness, then planarization of the photoresist film is difficult.

The photoresist film is exposed with radiation from an exposure source such as an excimer laser or a broadband Hg/Xe lamp that passes through a mask containing the device pattern to be reproduced on the substrate. The mask has a patterned opaque coating such as chrome on a transparent substrate like quartz. A good lithography process is defined as one that has a manufacturable process window in which there is a wide dose latitude and focus latitude for printing the pattern in the photoresist film. Generally, a depth of focus (DOF) of about 0.4 to 1 micron and a dose latitude of at least 10 to 20% is desirable for maintaining a printed feature size within ±10% of a targeted value. One can appreciate that if the photoresist layer has a thickness variation of 0.1 micron or more, then a significant portion of the DOF budget has been consumed by material aspects and not by the exposure process itself. Typically, the spin coating process is optimized so that the photoresist thickness variation is minimized to a value of less than 10 Angstroms across the wafer. This is accomplished on planar substrates by varying the spin speed during the coating process and by wetting the substrate with a solvent prior to applying the photoresist solution.

The relationship of photoresist thickness to the radiation dose or energy required to print a pattern in the film is provided in FIG. 1. The plot of thickness vs. dose forms a sinusoidal curve 5 that has minima 1, 3 and maxima 2, 4. This "swing" curve has an amplitude A between a minimum and a maximum energy and a periodicity B defined as the distance (thickness) between two adjacent minimum points or two adjacent maximum points on the curve 5. The magnitude of periodicity B is related to the wavelength of the exposing radiation. The amplitude A is calculated by dividing the difference between the energy for maximum point 2 ($E_2$) and the energy for minimum point 1 ($E_1$) by the average of $E_1$ and $E_2$ which is $(E_2-E_1)/(E_1+E_2/2)$ and this value can be as large as 0.3 which is a swing of 30% in dose.

The swing effect is caused because radiation that passes through the photoresist is partially reflected off the underlying layer and can either constructively or destructively interfere with radiation making a first pass through the photoresist. The extent of constructive or destructive interference depends upon the thickness of the film and the wavelength of the radiation. The swing amplitude has a detrimental effect on the patterning process, especially if it is more than a few % of the average dose. Consider the condition in FIG. 1 where a swing amplitude of 30% is realized as determined previously for $E_1$ and $E_2$ and the patterned feature is a contact hole. If a dose $E_1$ is used to form a contact hole in a photoresist that has a region with a thickness $T_1$ and a region with a thickness $T_2$, then the size of the hole with thickness $T_1$ will be much larger than the hole size with thickness $T_2$ since the latter requires a much higher energy to form a hole to a predetermined size. The size difference in space width of the hole is likely to be much greater than the ±10% specification described earlier for a manufacturing process.

In some situations, an anti-reflective coating (ARC) is applied to the substrate prior to the photoresist coating in order to control reflectivity during the photoresist exposure step and enable a larger process latitude by reducing the swing effect. The ARC which can be an organic or inorganic material is normally much thinner than the photoresist and is most effective on relatively flat substrates. While some organic ARCs have been developed for spin coating over features such as contact holes, there are none available that can completely planarize a surface with topography variations of about 0.1 microns or larger.

Planarization methods have been proposed for different applications in prior art. In U.S. Pat. No. 5,077,234, a process is provided for filling STI trenches of varying widths. The method requires three photoresist layers. A first photoresist is patterned to fill only large trenches of greater than 30 microns in width. This photoresist plug is then hardened by a combination of heating to 200° C. and UV exposure. A second photoresist is coated and baked to >150° C. and then etched back until the layer is removed over active regions. Then a third photoresist layer is coated and etched back to form a planar layer.

In U.S. Pat. No. 6,008,105, a process is described for planarizing a depression formed in an insulating layer that is deposited over interconnect lines. A mask pattern is used to selectively leave photoresist that fills the depression. The photoresist is baked at 150° C. to remove solvent and then cured by UV radiation. A second photoresist is coated on the substrate and etched back to form a planar surface. This technique requires a new mask to be built for each pattern of interconnect lines and can be expensive since several metal layers are present in a device.

U.S. Pat. No. 5,618,751 describes a method of forming a trench capacitor that requires a photoresist to be coated over a trench that is <0.5 microns wide. Since the opening is small, the photoresist does not fill the trench and must be heated above its softening point so that it flows into the trench. The photoresist is preferably exposed with an electron beam source to avoid diffraction effects and formation of standing waves on the sidewalls of the trench. The photoresist is developed to form a recessed layer within the trench that serves as an etch stop for etching an adjacent diffusion source layer to a prescribed depth. A point is made that the electron beam exposure yields a more planar photoresist surface within the trench than photolithography with Deep UV (248 nm), i-line (365 nm) or mid UV (435 nm) radiation sources. However, this patent does not mention a solution for forming a planar photoresist over a substrate that has both isolated and dense trench patterns.

Other background art found in U.S. Pat. No. 6,218,196 deals with a problem of etching a pattern that contains both dense and isolated lines. The space between dense lines etches slower than the region along isolated lines and creates a reactive ion etch (RIE) lag. An apparatus and etching method are provided that includes a deposition gas such as $CHF_3$ that forms a protective layer on the photoresist sidewalls to prevent notching and an etching gas mixture of $Cl_2$ and $BCl_3$. The reactive products from $CHF_3$ and $Cl^-$ excessively react at isolated lines to produce a higher deposition rate that decreases the etch rate difference between isolated and dense lines.

Besides the planarization requirement cited previously for dielectric layers on interconnect lines, for filling STI trenches, and for forming trench capacitors, another application shown in FIG. 2 that needs a planar photoresist layer is a dual damascene process in which a trench is patterned above a substrate 10 and etch stop layer 11 that includes both isolated 13a and dense via holes 13b–13e in dielectric layer 12. In this case, the photoresist 14 thickness over the dense via hole region is thinner than over the isolated hole 13a because a considerable amount of photoresist is used to fill the dense holes 13b–13e. The difference in photoresist thickness is represented by the distance D1 and can be over 2000 Angstroms. This is a large variation that can reduce DOF for the patterning process and result in a large difference in trench opening sizes that are formed above the holes. One current solution to the problem that is practiced by the inventors is to etch back the photoresist 14 and repeat the photoresist coating and etch back process several times in order to form a planar photoresist. However, this is costly in terms of slow throughput as well as material and equipment usage. An improved method is needed that has faster throughput and has a minimal cost impact on the manufacturing scheme.

SUMMARY OF THE INVENTION

An objective of the present invention is to provide a photoresist planarization process that is low cost and can be readily implemented in a manufacturing environment.

A further objective of the present invention is to provide a photoresist planarization method that can be used in a dual damascene process where trenches are patterned above both isolated and dense via holes in the same pattern.

A still further objective of the present invention is to provide a planarization method that can be applied to fabricating metal-insulator-metal capacitors in which contact holes having regions of low and high duty ratios exist in the same pattern.

According to one embodiment, these objectives are accomplished by providing a substrate that has a patterned dielectric layer comprised of both isolated and dense via holes formed thereon. A first photoresist layer is spin coated on the dielectric layer and baked at a high enough temperature so that the photoresist reflows into the holes and thereby forms an uneven thickness above the dielectric layer. The photoresist is blanket exposed without a mask and is developed to remove all photoresist above the dielectric layer and form a recessed layer of photoresist within the holes. A high temperature bake of 250° C. is performed to remove any remaining solvent in the photoresist and to harden the film. Preferably, the photoresist is comprised of a Novolac resin and a diazonaphthoquionone photoactive compound which form a crosslinked network that becomes impervious to organic materials or solvents that are coated on it. Then a second photoresist is spin coated on the dielectric layer having holes containing the recessed hardened photoresist to form a planar layer that can be controllably patterned with trenches that are aligned above the contact holes. Conventional processing is then followed to form metal interconnects.

In a second embodiment that relates to metal-insulator-metal (MIM) capacitor technology, a substrate is provided with a dielectric layer having contact hole regions with different duty ratios in which a bottom electrode such as TiN has been deposited. A first photoresist layer is spin coated and baked at a high enough temperature so that the photoresist reflows into the holes and thereby forms an uneven thickness above the metal layer. The photoresist is blanket exposed without a mask and developed to remove all photoresist above the metal layer except for a recessed layer of photoresist within the holes. A high temperature bake of 250° C. is performed to remove any remaining solvent and to harden the film. Preferably, the photoresist includes a Novolac resin and a diazonaphthoquionone photoactive compound which form a crosslinked network that becomes impervious to organic materials or solvents that are coated on it. Then a second photoresist is spin coated on the metal layer and covers the holes containing the recessed hardened photoresist to form a planar layer. The photoresist is then etched back until it forms a recessed layer within the holes. A second etch is then performed to etch back the TiN layer until it is about coplanar with the recessed photoresist layer. The remaining photoresist is then removed by a plasma ashing process and conventional processing is followed to complete the MIM capacitor.

DETAILED DESCRIPTION OF THE INVENTION

Preferred embodiments of the present invention will be described with reference to the accompanying drawings. The description of the fabrication of a dual damascene structure and a MIM capacitor are provided as an example and not as a limitation as to the scope of the present invention. For example, the embodiments refer to a method of planarizing a photoresist over contact hole patterns but the invention is equally effective in planarizing patterns containing other features such as trenches.

Figure 2:
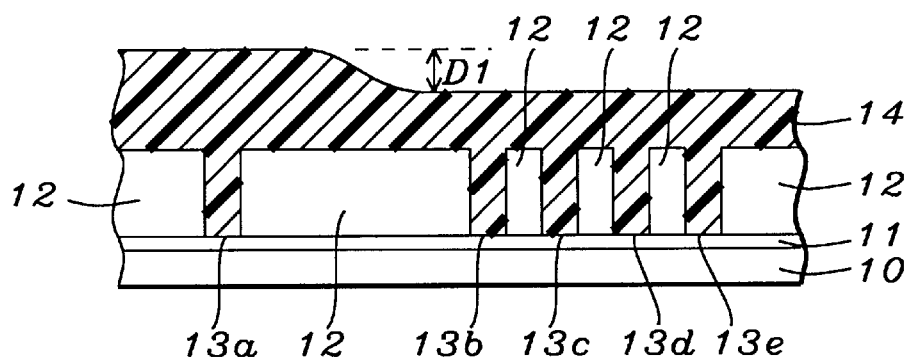
FIG. 2 is a cross-sectional view showing an uneven photoresist layer that is formed after reflowing the resist into a pattern that contains isolated and dense via holes.

The first embodiment is illustrated in FIGS. 2–7. Referring to FIG. 2, a substrate 10 is provided that typically contains a substructure (not shown) comprising conducting and insulating layers. The details of these layers have been omitted in order to simplify the drawing and to focus attention on the key features of the present invention. An etch stop layer 11 is formed on substrate 10 and is normally a material such as silicon nitride, silicon oxynitride, or silicon carbide that is deposited by a technique such as chemical vapor deposition (CVD).

A dielectric layer 12 is deposited on etch stop 11 and is patterned by conventional means to generate via holes that include an isolated hole 13a and dense holes 13b–13e. Dielectric layer 12 is selected from a group including $SiO_2$, carbon doped $SiO_2$, fluorosilicate glass, polysilsesquioxanes, polyarylethers, polyimides, and other low k dielectric materials, and has a thickness in the range of about 2000 to 20000 Angstroms. Via holes 13a–13e can be formed with various duty ratios depending upon the device pattern. A duty ratio is defined as the space occupied by the via holes divided by the total area of the pattern. The duty ratio approaches 0 for patterns containing only isolated holes and approaches 0.5 for a densely populated hole pattern.

The present invention is most effective for patterns having both low duty ratio and high duty ratio regions. FIG. 2 is not necessarily drawn to scale and the distance between hole 13a and its nearest neighboring hole 13b may be more than 10 times the width of hole 13a. It is understood that the pattern is more complex than represented by the drawing and from a top-down view, the isolated and dense holes can form many designs in an (x, y) coordinate grid that is bounded by the edge of the substrate.

Figure 1:
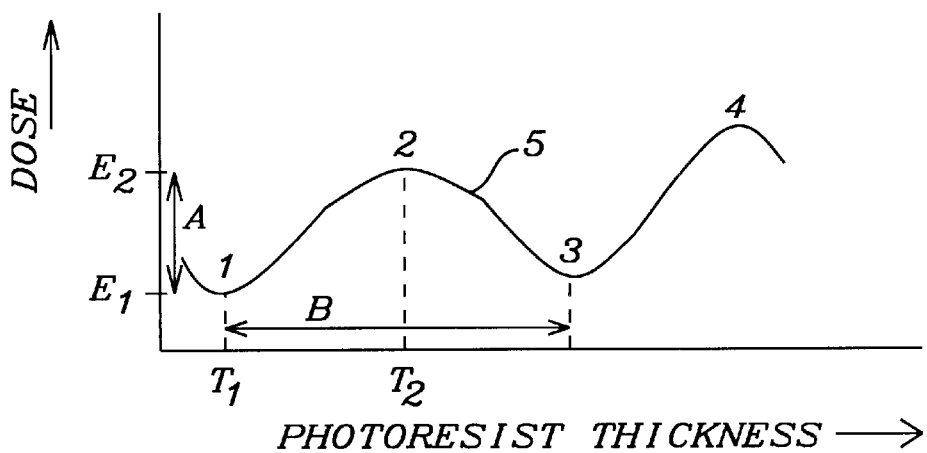
FIG. 1 is a drawing illustrating a swing curve in which the energy required to pattern a photoresist layer varies with the photoresist thickness.

A photoresist solution in an organic solvent is spin coated on dielectric layer 12 and partially dries while spinning but may not completely fill holes 13a–13e. When the substrate 10 is baked at about 90° C. to 130° C. for up to 2 minutes, the partially dried photoresist layer 14 reflows such that it completely fills via holes 13a–13e. Although photoresist layer 14 has a relatively thick film in the range of 5000 to 35000 Angstroms, the thickness in a region over holes 13b–13e is less than the thickness in a region over isolated hole 13a by a distance D1 shown in FIG. 2. A thickness variation D1 occurs because a considerably larger amount of photoresist 14 is needed to fill dense holes than an isolated hole. The magnitude of D1 can be as high as 2000 Angstroms which is much larger than the desirable target of about 10 Angstroms that is observed when forming a photoresist layer on a flat surface. If photoresist layer 14 in FIG. 2 is patterned, then D1 will cause swing effects as described previously during an explanation of the swing curve in FIG. 1. In the case of trenches formed above via holes in a dual damascene scheme, the variation in the size of the resulting trenches will be unacceptable if no planarization of the photoresist layer is achieved before the patterning process.

Photoresist 14 is preferably a positive tone composition in which the solubility of exposed regions changes. When the exposed pattern is treated with a developer that is usually an aqueous base solution, then the soluble exposed regions are washed away while any unexposed regions remain insoluble and are not removed. Different types of positive tone compositions are available and have been developed for a particular exposure wavelength such as Deep UV (248 nm), i-line (365 nm), or Mid UV (435 nm).

Preferably, the photoresist 14 is comprised of a Novolac resin and a diazonaphthoquinone (DNQ) photoactive compound which is useful for exposing wavelengths between about 300 and 500 nm. The Novolac resin that comprises a majority of photoresist layer 14 generally has a glass transition temperature (Tg) between about 90° C. and 130° C. that enables the photoresist to reflow into holes 13a–13e following spin coating and baking at or slightly above the Tg. The DNQ compound and traces of organic solvent in the resin matrix tend to lower the melt temperature of layer 14 below the glass transition temperature of the Novolac resin.

Figure 3:
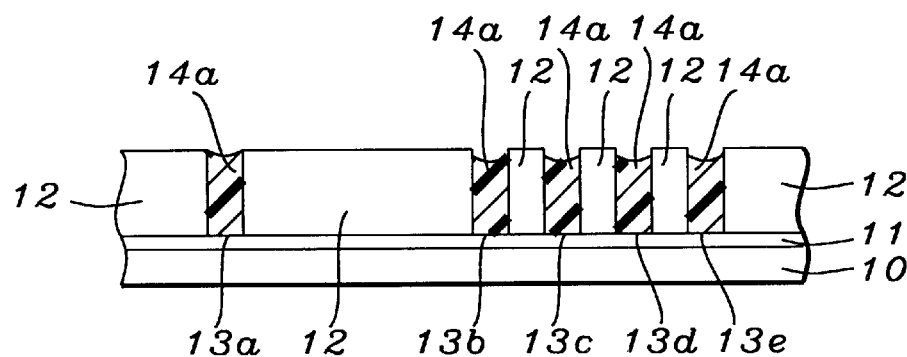
FIG. 3 is a cross-sectional view of the structure shown in FIG. 2 after the photoresist layer is blanket exposed and developed.

Referring to FIG. 3, the photoresist layer 14 in FIG. 2 is blanket exposed without a patterned mask and is then developed in an aqueous base solution to remove all photoresist 14 above dielectric layer 12 and to form a recessed photoresist layer 14a within the via holes 13a–13e. Note that the level of photoresist 14a in isolated hole 13a is higher than in holes 13b–13e since a thicker photoresist film 14 covered 13a during the exposure and therefore a smaller dose of radiation reached via hole 13a than penetrated holes 13b–13e. Those skilled in the art recognize that the radiation dose varies as a function of depth into an absorbing film. Regions near the top of a photosensitive layer receive a higher dose than regions near the bottom of the layer. In this example, the blanket exposure dose for photoresist 14 is adjusted so that the region near the top of via holes 13a–13e in FIG. 2 receives a low dose while the lower part of holes 13a–13e receives little or no dose. The dose that reaches the lower part of holes 13a–13e is below a threshold value that is needed to convert enough of the DNQ compound to a base soluble material that makes layer 14 soluble. Therefore, regions 14a are insoluble in developer and remain in holes 13a–13e.

The blanket exposure dose for layer 14 can be delivered by a scanner or stepper exposure system or by a lower cost method involving a flood exposure tool that is available from suppliers like Fusion Systems. A broadband Hg/Xe lamp exposes a substrate on a rotating stage during flood exposure with a range of wavelengths from about 300 nm to about 500 nm. A filter may be added to narrow the wavelength range that exposes the substrate. Alignment capability is not necessary for this step.

Figure 4:
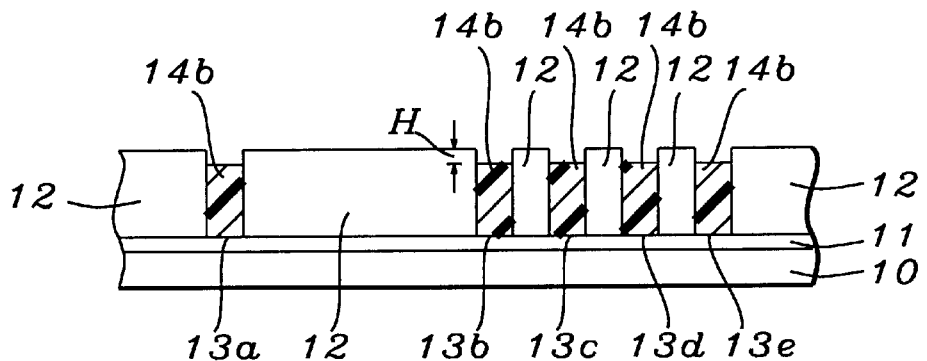
FIG. 4 is a cross-sectional view of the structure in FIG. 3 after a hardening step.

Photoresist 14a is then thermally hardened by heating the substrate 10 on a hot plate at about 250° C. for about 2 minutes. A transformed layer 14b results as shown in FIG. 4 which consists of a crosslinked matrix comprised Novolac polymer and a thermal product of DNQ. The thermal treatment has removed any traces of organic solvent and water from layer 14b. As a result, layer 14b is impervious to organic solvent and photoresist that is coated on it.

Layer 14b is likely to have a lower thickness in holes 13a–13e than layer 14a since the hardening step compacts the matrix and removes any solvents or water. The depth to which hardened layer 14b is recessed in holes 13a–13e can vary. For a minimum depth, the hardened layer 14b can be coplanar with the top of hole 13a. A maximum depth in holes 13b–13e as indicated by H in FIG. 4 is limited by the ability to form a planar layer on dielectric layer 12 in a subsequent photoresist coating step. Clearly, if H is too large, then an unacceptable thickness variation will also be realized in a second photoresist coating. Generally, a value of H which is from 0% to 30% of the depth of holes 13a–13e is necessary to form a planar layer in the next step of this method.

Figure 5:
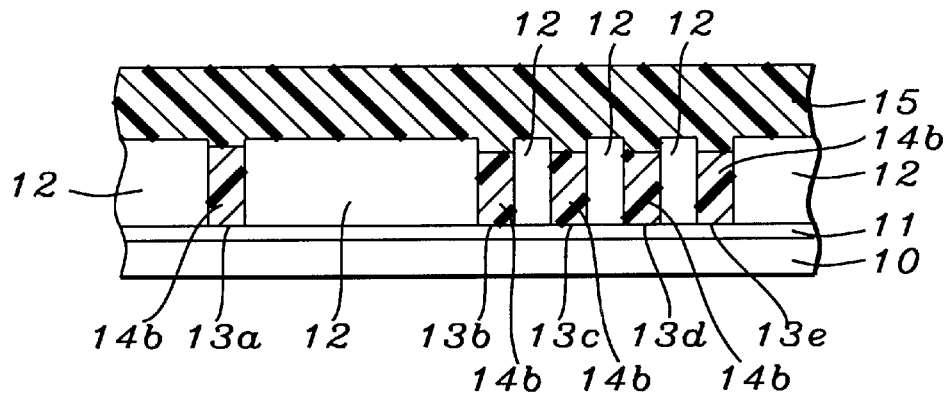
FIG. 5 is a cross-sectional view of the structure in FIG. 4 after a second photoresist layer is spin coated to form a planar layer.

A second photoresist is then spin coated on dielectric layer 12 and baked in a range from about 90° C. to 150° C. to form a photoresist layer 15 having a thickness between about 5000 and 35000 Angstroms as shown in FIG. 5. Typically, a solvent like propylene glycol monomethylether acetate (PGMEA) or ethyl lactate is applied as the first step in the photoresist coating process to enable a more uniform layer 15 to be produced. This solvent does not interact with layer 14b because of the previous hardening step. Layer 15 also fills holes 13a–13e. A key feature is that layer 15 is essentially planarized because of the process outlined in FIGS. 2–4. For example, starting with a D1 of 2060 Angstroms in a 3.4 micron thick photoresist layer 14, the method described in the first embodiment is followed to provide a photoresist layer 15 with only a 50 Angstrom thickness variation.

Figure 6:
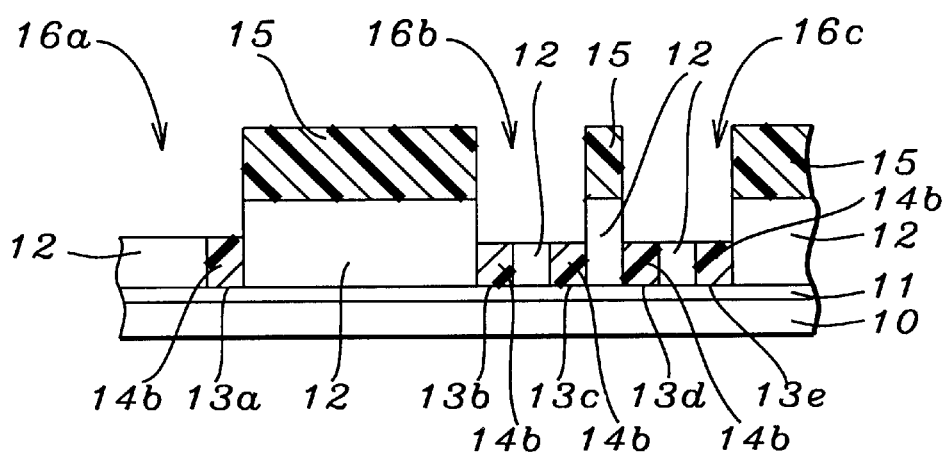
FIG. 6 is a cross-sectional view showing trench pattern formation in the second photoresist layer.

Photoresist layer 15 is preferably a positive tone photoresist and is patternwise exposed through a mask and developed to form trench openings 16a, 16b, 16c shown in FIG. 6. The exposure wavelength is selected based on the width of trench openings 16a–16c. If the width is larger than about 300 nm, then an i-line exposure is generally preferred. For a width in the range of about 130 nm to about 300 nm, then a Deep UV exposure is typically employed. For sub-130 nm openings, a sub-200 nm exposure wavelength such as a 193 nm or 157 nm wavelength from an excimer laser source is preferred. Each of these wavelengths requires a photoresist composition that has been tuned for that wavelength. It should also be noted that a thinner photoresist 15 thickness is needed as the width of trench openings decreases in order to maintain an adequate process window for the patterning step.

The unexposed portions of photoresist layer 15 serve as an etch mask during a plasma etch to transfer the trench pattern partially through dielectric layer 12. The trenches 16a–16c are aligned above via holes 13a–13e. The alignment is not limited to the example shown in FIG. 6 where one trench connects two via holes. In some designs, one trench is formed above each via hole and the present invention is equally effective in either case. The details of the etch process are not given here since they are well known to those skilled in the art.

Figure 7:
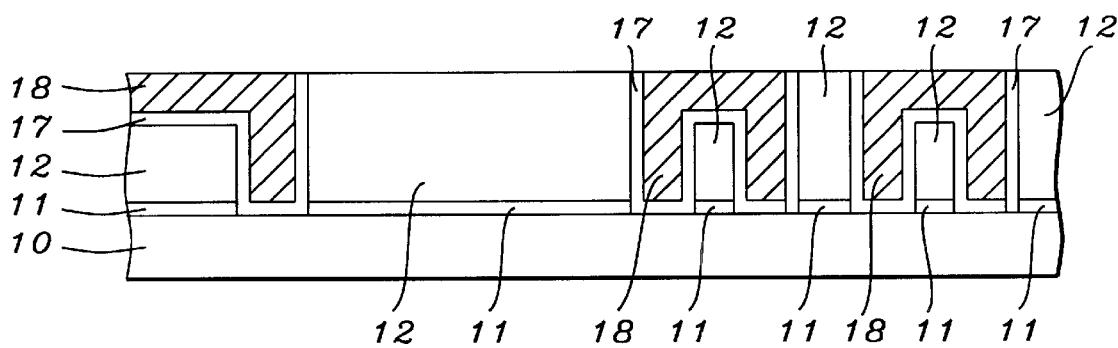
FIG. 7 is a cross-sectional view showing completion of a dual damascene structure.

Photoresist layers 15 and 14b are then removed by a plasma ash process that normally involves oxygen. An additional cleaning step may be necessary to remove any traces of photoresist residue before proceeding to fill the trenches and via holes with a conductive material. A barrier metal liner 17 as shown in FIG. 7 is deposited by a CVD technique on the sidewalls and bottom of trenches 16a–16c and of via holes 13a–13e. The liner 17 is typically comprised of a material such as Ti, Ta, W, TiN, TaN, TiW, or WN. Then a metal 18 is deposited by an electroplating, sputtering, or evaporating process to a level that is above the top of dielectric layer 12. Metal 18 is preferably copper or a copper alloy, aluminum or an aluminum alloy, or tungsten or a tungsten alloy. A planarizing step such as chemical mechanical polishing is employed to lower the level of metal 18 so that it is coplanar with dielectric layer 12 to complete the dual damascene structure pictured in FIG. 7.

The method shown in FIGS. 2–7 is an advantage over prior art in that a planar photoresist 15 for the trench patterning step can be achieved with a minimum amount of process time and materials. Existing tools and materials are utilized. The method is independent of trench and via hole design and is effective for patterns containing via hole arrays with different duty ratios. The coating, exposing, and developing of photoresist 14 can all be performed in one flow or job sequence and is especially low cost if the blanket exposure is done with a relatively inexpensive flood exposure tool rather than a more expensive scanner or stepper. An additional benefit is provided by the first photoresist layer 14 that fills most of via holes 13a–13e in that the second photoresist layer 15 for patterning trenches does not require a high dose to reach the bottom of via holes 13a–13e. This allows a faster throughput during the exposure step that results in a lower cost manufacturing process. Furthermore, photoresist residues that are often formed in the bottom of via holes after the exposed photoresist is developed are avoided by this method.

Figure 8:
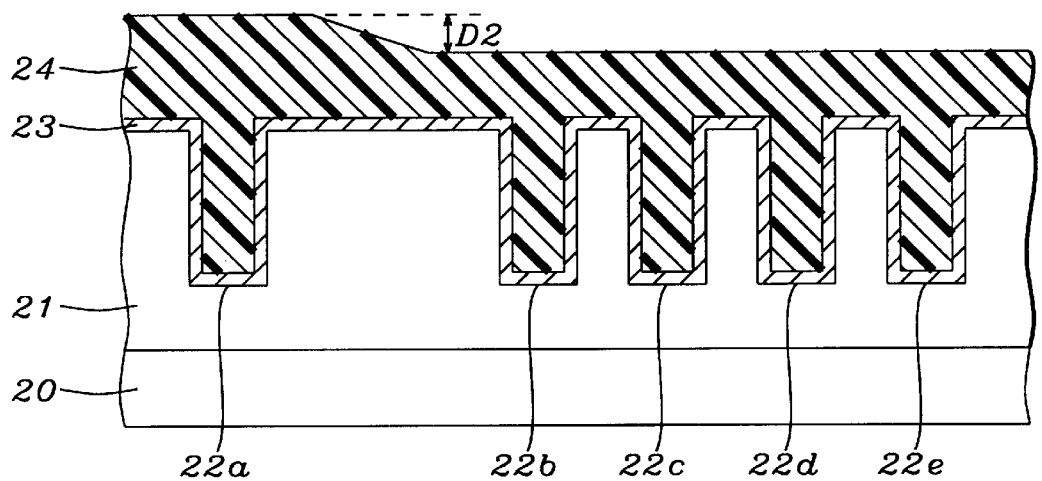
FIG. 8 is a cross-sectional view showing a metal-insulator-metal (MIM) device after a photoresist application on a substrate containing contact holes that are lined with a layer of metal.

A second embodiment of the present invention is set forth in FIGS. 8–13 with regard to fabrication of a metal-insulator-metal (MIM) capacitor. Referring to FIG. 8, a substrate 20 is provided that typically contains a substructure (not shown) comprising conducting and insulating layers. The details of these layers have been omitted in order to simplify the drawing and to focus attention on the key features of the present invention. A dielectric layer 21 is deposited on substrate 20 and is patterned by conventional means to generate contact holes that include a low duty ratio region containing hole 22a and a high duty ratio region containing dense holes 22b–22e. Dielectric layer 21 is selected from a group including $SiO_2$, carbon doped $SiO_2$, fluorosilicate glass, polysilsesquioxanes, polyarylethers, polyimides, and other low k dielectric materials, and has thickness in the range of about 2000 to 20000 Angstroms. Contact holes 22a–22e can be formed with various duty ratios depending upon the device pattern. A duty ratio is defined as the space occupied by the contact holes divided by the total area of the pattern. The duty ratio approaches 0 for patterns containing only isolated holes and approaches 0.5 for a densely populated hole pattern. The present invention is most effective for patterns having contact holes with both low duty and high duty ratios. FIG. 8 is not necessarily drawn to scale and the distance between hole 22a and its nearest neighboring hole 22b may be more than 10 times the width of hole 22a. Moreover, the low duty ratio region represented by hole 22a may consist of two or more holes grouped together. Only one hole 22a is shown for a low duty ratio region to simplify the drawings. It is understood that the pattern is more complex than represented by the drawing and from a top-down view, the low duty ratio and high duty ratio regions can form many designs in an (x, y) coordinate grid that is bounded by the edge of the substrate.

A conducting material that is preferably TiN or TIN/W is then deposited by a CVD technique and forms a conformal layer 23 on the surface of oxide 21 and within the contact holes 22a–22e. The thickness of metal layer 23 which forms the bottom electrode of the MIM capacitor is between 100 and 500 Angstroms. Other suitable conducting materials such as TaN and WN can also be used to form metal layer 23.

A photoresist solution in an organic solvent is spin coated on metal layer 23 and partially dries while spinning but may not completely fill holes 22a–22e. When the substrate 20 is baked at about 90° C. to 130° C. for up to 2 minutes, the partially dried photoresist layer 24 reflows such that it completely fills via holes 22a–22e. Although photoresist layer 24 is a relatively thick film in the range of about 5000 to 35000 Angstroms, the thickness in a region over holes 22b–22e is less than the thickness in a region over hole 22a by a distance D2 shown in FIG. 8. A thickness variation D2 occurs because a considerably larger amount of photoresist 24 is needed to fill holes in high duty ratio regions than in low duty ratio regions. The magnitude of D2 can be as high as 2000 Angstroms which is much larger than the desirable target of about 10 Angstroms that is observed when forming a photoresist layer on a flat surface. A D2 of less than about 200 Angstroms is desired so that in a subsequent etch back step, the recessed depth of hardened photoresist 24a in hole 22a will be approximately the same as the recessed depth of layer 24a within holes 22b–22e. This requirement will become clearer during a description of FIGS. 11–12.

Photoresist 24 is preferably a positive tone composition in which the exposed regions become soluble in a developer. When the exposed pattern is treated with a developer that is generally an aqueous base solution, then the soluble exposed regions are washed away while any unexposed regions remain insoluble and are not removed. Different types of positive tone compositions are available and have been developed for a particular exposure wavelength such as Deep UV (248 nm), i-line (365 nm), or Mid UV (435 nm).

Preferably, the photoresist 24 is comprised of a Novolac resin and a diazonaphthoquinone (DNQ) photoactive compound which is useful for exposing wavelengths between about 300 and 500 nm. The Novolac resin that comprises a majority of photoresist layer 24 generally has a glass transition temperature (Tg) between about 90° C. and 130° C. that enables the photoresist to reflow into holes 22a–22e following spin coating and baking at or slightly above the Tg. The DNQ compound and traces of organic solvent tend to lower the melt temperature of layer 24 below the glass transition temperature of the Novolac resin.

Figure 9:
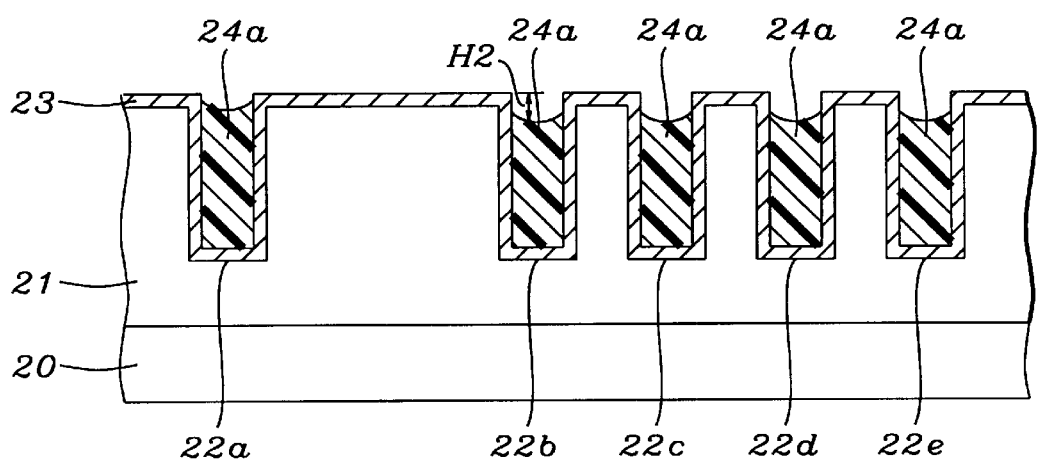
FIG. 9 is a cross-sectional view after the photoresist layer in FIG. 8 is blanket exposed and developed to form a recessed layer within the holes.

Referring to FIG. 9, the photoresist layer 24 in FIG. 8 is blanket exposed without a patterned mask and is then developed in an aqueous base solution to remove all photoresist 24 above metal layer 23 except for a recessed photoresist layer 24a within the contact holes 22a–22e. Note that the level of photoresist 24a in hole 22a is higher than in holes 22b–22e since a thicker photoresist film 24 covered 22a during the exposure and therefore a smaller dose of radiation reached contact hole 22a than penetrated holes 22b–22e. Those skilled in the art recognize that the radiation dose varies as a function of depth into an absorbing film. Regions near the top of a photosensitive layer receive a higher dose than regions near the bottom of the layer. In this example, the blanket exposure dose for photoresist 24 is adjusted so that the region near the top of via holes 22a–22e in FIG. 8 receives a low dose while the lower part of holes 22a–22e receives little or no dose. The dose that reaches the lower part of holes 22a–22e is below a threshold value that is needed to convert enough of the DNQ compound to a base soluble material that makes layer 24 soluble. Therefore, regions 24a are insoluble in developer and remain in holes 22a–22e.

The blanket exposure dose for layer 24 can be delivered by a scanner or stepper exposure system or by a lower cost method involving a flood exposure tool that is available from suppliers like Fusion Systems. A broadband Hg/Xe lamp exposes a substrate on a rotating stage during flood exposure with a range of wavelengths from about 300 nm to about 500 nm. A filter may be added to narrow the wavelength range that exposes the substrate. Alignment capability is not necessary for this step.

Photoresist 24a is then thermally hardened by heating the substrate 20 on a hot plate at about 250° C. for about 2 minutes. A transformed layer 24b results as shown in FIG. 4 which consists of a crosslinked matrix comprised of Novolac polymer and a thermal product of DNQ. The thermal treatment has removed any traces of organic solvent and water from hardened layer 24b. As a result, hardened layer 24b is impervious to organic solvent and photoresist that is coated on it.

Layer 24b is likely to have a lower thickness in holes 22a–22e than layer 24a since the hardening step compacts the layer and removes any solvents or water. The depth to which hardened layer 24b is recessed in holes 22a–22e can vary. For a minimum depth, the layer 24b can be coplanar with the top of hole 22a. A maximum depth in holes 22b–22e as indicated by H2 in FIG. 9 is limited by the ability to form a planar layer on metal layer 23 in a subsequent photoresist coating step. Clearly, if H2 is too large, then an unacceptable thickness variation will also be realized in a second photoresist coating. Generally, a value of H2 which is from 0% to 30% of the depth of holes 22a–22e is necessary to form a planar layer in the next step of this method.

Figure 10:
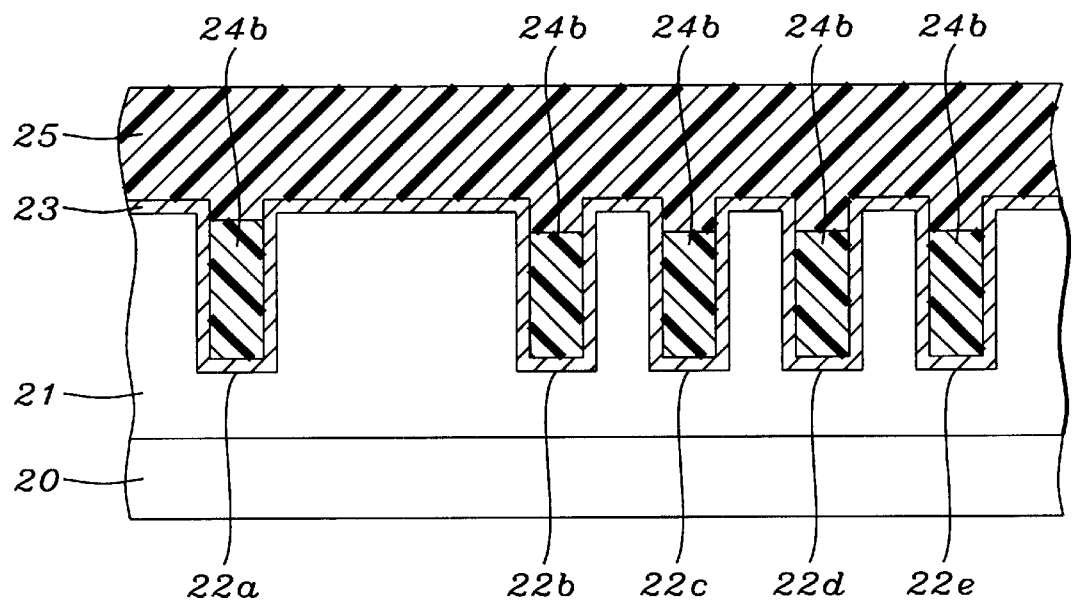
FIG. 10 is a cross-sectional view after the photoresist layer in FIG. 9 is thermally hardened.

A second photoresist is then spin coated on conducting layer 23 and baked in a range from about 90° C. to 150° C. to form a photoresist layer 25 having a thickness between about 5000 and 35000 Angstroms as shown in FIG. 10. Normally, a solvent like propylene glycol monomethylether acetate (PGMEA) or ethyl lactate is applied as the first step in the photoresist coating process to enable a more uniform layer 25 to be produced. This solvent does not interact with hardened layer 24b because of the previous hardening step. Layer 25 also fills the holes 22a–22e. A key feature is that layer 25 is essentially planarized because of the process outlined in FIGS. 8–10. For example, starting with a D2 of about 2000 Angstroms in a 3 micron thick photoresist layer 24, the method described in the second embodiment is followed to provide a photoresist layer 25 with about a 50 Angstrom thickness variation.

Figure 11:
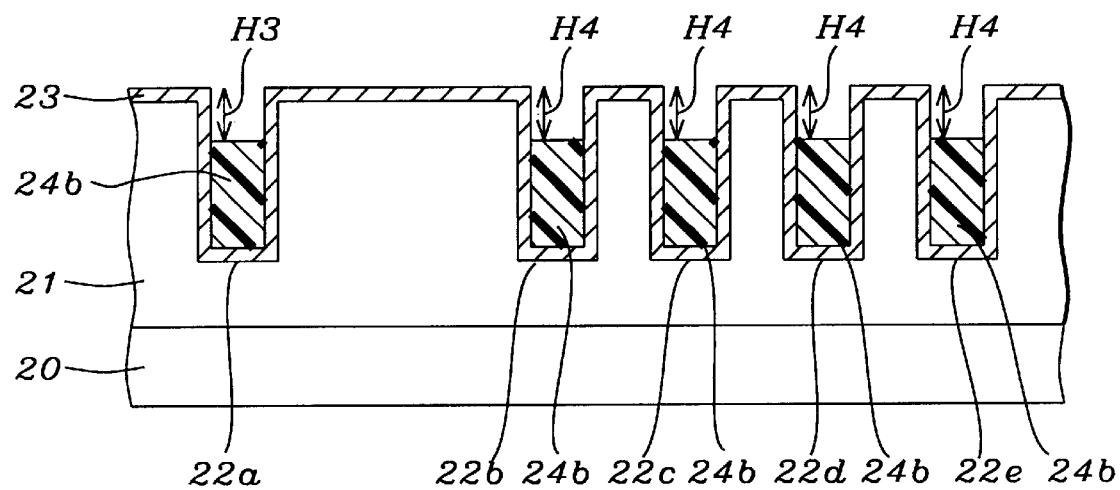
FIG. 11 is a cross-sectional view after a second photoresist is spin coated on the structure in FIG. 10 to form a planar layer.

Photoresist layer 25 is not exposed in this process and can be any photoresist composition or even a polymer solution that is capable of forming uniform coatings of the required thickness mentioned previously. Photoresist 25 preferably has an etch rate similar to hardened layer 24. Photoresist 25 is subjected to an etch back step in which a plasma etch preferably involving an oxygen gas is performed to remove all of layer 25 above metal layer 23 and in contact holes 22a–22e. The etch also removes some of hardened layer 24b to give a recessed depth H3 in hole 22a and H4 in holes 22b–22e as shown in FIG. 11. Conditions for the etch are a $O_2$ flow rate of about 90 standard cubic centimeters per minute (sccm), an argon flow rate of about 20 sccm, a chamber pressure of 8 mTorr, a RF power of about 1200 Watts for a period of 120 seconds.

The desired magnitude of H3 and H4 are in a range of about 500 to 3000 Angstroms. The benefit of the method of the second embodiment is apparent when comparing experimental results to a prior art method. For example, when photoresist 24 with a thickness variation D2 is etched back by the process similar to the one described in the previous paragraph, then a recess depth in holes in low duty regions is about 3690 Angstroms and the recessed depth in holes in high duty regions is about 5600 Angstroms. The 1910 Angstrom difference is unacceptably large for this device and will result in a MIM capacitor with a low performance. On the other hand, when the process illustrated by FIGS. 8–11 is followed, then an H3 of 2280 Angstroms and an H4 of 2670 Angstroms is provided in holes 22a–22e that have a total depth of 14140 Angstroms. The difference of 390 Angstroms is acceptable for this device and results in a MIM capacitor with a high performance. Therefore, the implementation of the second embodiment has significantly improved the fabrication method.

Optionally, prior art methods may involve several cycles of coating a photoresist layer 24 and etching it back before D2 is reduced to an acceptable level. However, this technique is time consuming and costly in terms of material and tool usage and increased substrate handling is likely to cause more defects. Therefore, the method described for FIGS. 8–11 is more desirable in terms of lower cost and fewer defects.

Figure 12:
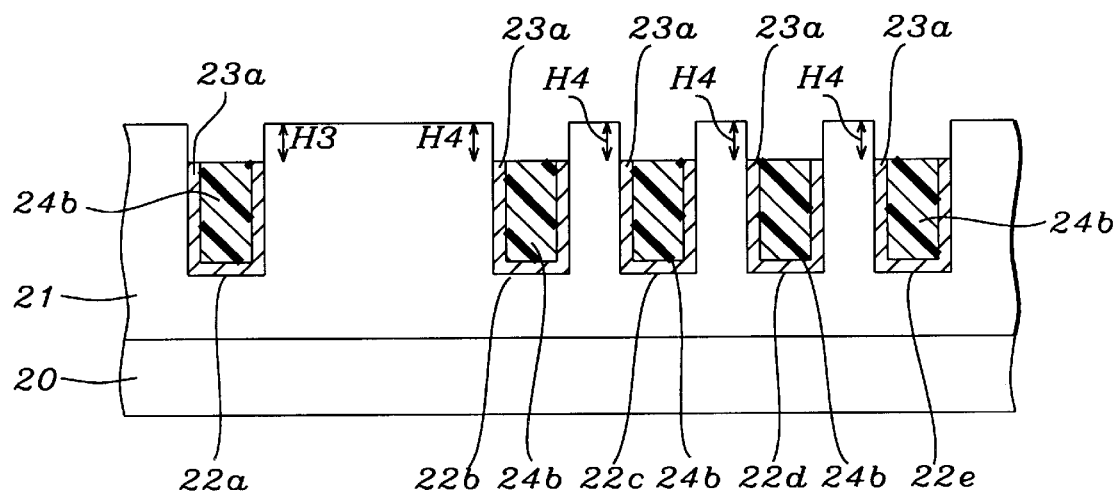
FIG. 12 is a cross-sectional view after the photoresist in FIG. 11 is etched back to form a recessed layer within the holes.
Figure 13:
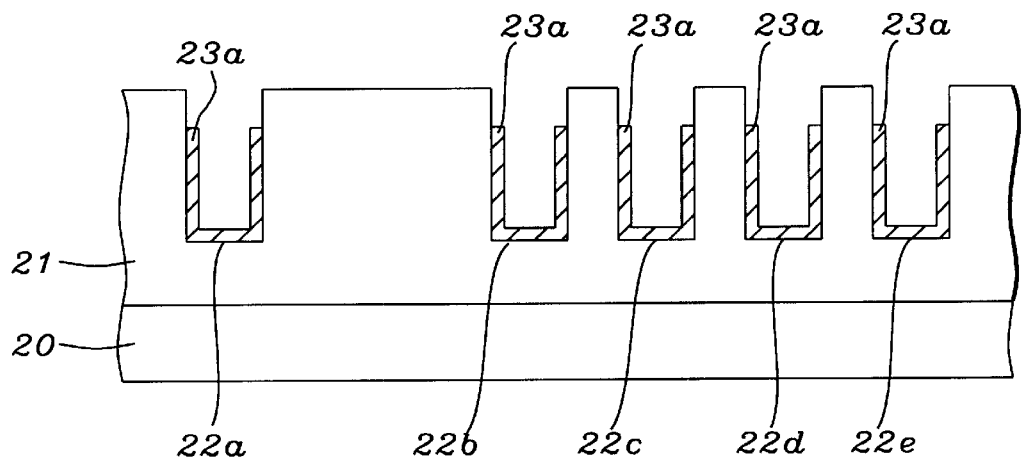
FIG. 13 is a cross-sectional view after the metal liner is etched to a level that is about coplanar with the photoresist layer in the contact holes.

The metal layer 23 is then plasma typically etched by a process comprised of a 50 to 110 sccm flow rate of $Cl_2$, a chamber pressure of 5 to 12 mTorr, and a RF power of 700 to 1500 Watts. This step lowers the metal layer 23 to a level that is about coplanar with the hardened layer 24b in holes 22a–22e. The importance of achieving a fairly even depth of H3 and H4 in FIG. 11 is that this condition enables the bottom electrode 23a to be recessed to a similar depth in holes 22a–22e as shown in FIG. 12.

Figure 14:
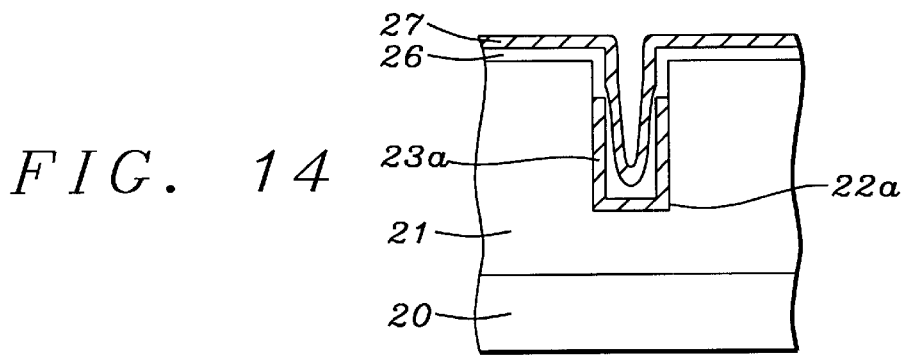
FIG. 14 is a cross-sectional drawing of a MIM capacitor after an insulating layer and the top electrode are deposited.

The MIM capacitor is then completed by conventional steps of depositing an insulator layer 26 and a top electrode layer 27 as depicted in FIG. 14 for an isolated capacitor fabricated from hole 22a and then defining the top plate pattern (not shown).

The method of the second embodiment can be readily implemented in a manufacturing environment since existing tools and materials are utilized. The method is independent of contact hole design and is effective for patterns containing contact holes with different duty ratios. The coating, exposing, and developing of photoresist 24 can all be performed in one flow or job sequence and is especially low cost if the blanket exposure is done with a relatively inexpensive flood exposure tool rather than a more expensive scanner or stepper.

While this invention has been particularly shown and described with reference to the preferred embodiments thereof, it will be understood by those skilled in the art that various changes in form and details may be made without departing from the spirit and scope of this invention.

We claim:

1. A method for forming a planar photoresist layer on a substrate with regions having holes of different duty ratios comprising:

(a) providing a substrate with a layer comprised of a pattern containing holes in high duty ratio regions and in low duty ratio regions formed thereon, (b) coating a first photoresist layer on said substrate, (c) removing said photoresist from the surface of said substrate and forming a recessed layer of said photoresist in said holes, (d) hardening said recessed photoresist layer, and (e) coating a second photoresist layer on said substrate that forms a uniform thickness over holes in both high duty ratio regions and in low duty ratio regions.

2. The method of claim 1 wherein the low duty ratio regions are comprised of isolated holes and the high duty ratio regions are comprised of dense holes wherein the spacing between holes is approaching the space width within the holes.

3. The method of claim 1 wherein said first photoresist layer is a positive tone composition that includes a Novolac resin and a diazonaphthoquinone photoactive compound.

4. The method of claim 3 wherein said first photoresist layer is baked at a temperature slightly above the glass transition temperature of said first photoresist layer, preferably between about 90° C. and about 130° C.

5. The method of claim 4 wherein said photoresist is baked at a temperature such that said first photoresist reflows and completely fills said holes.

6. The method of claim 3 wherein a recessed photoresist layer is formed in said holes by exposing said first photoresist with an appropriate exposure dose and developing said photoresist.

7. The method of claim 6 wherein said first photoresist is exposed without a mask using one or more wavelengths in the range of about 300 nm to about 500 nm.

8. The method of claim 6 wherein the exposure is performed with a scanner or stepper tool that has alignment capability or with a flood exposure tool that does not have alignment capability.

9. The method of claim 1 wherein the depth of said recess in said holes is a distance that is from about 0% to 30% of the total depth of said hole.

10. The method of claim 1 wherein a thermal treatment is used to harden said first photoresist and comprises a baking step at about 250° C. for about 2 minutes.

11. The method of claim 1 wherein the second photoresist is a composition that is sensitive to one or more wavelengths in the range from about 10 nm to about 500 nm.

12. A method for forming a planar photoresist layer on a via hole pattern in a dual damascene process comprising:

(a) providing a substrate with a stack of layers formed thereon, said stack comprising an upper dielectric layer and a lower etch stop layer, said dielectric layer includes a via hole pattern having holes in high and low duty ratio regions, (b) coating a first photoresist layer on said dielectric layer, said photoresist is baked at a temperature such that the photoresist reflows and fills said via holes, (c) removing said photoresist from the surface of said dielectric layer and forming a recessed layer of said first photoresist in said holes, (d) hardening said recessed photoresist layer, and (e) coating a second photoresist layer on said substrate that forms a uniform thickness over holes in both high duty ratio regions and in low duty ratio regions.

13. The method of claim 12 further comprised of completing a dual damascene structure by exposing said second photoresist through a mask pattern to form trench openings that are aligned over said via holes, transferring said trench pattern into said dielectric layer with a plasma etch, removing first and second photoresists, forming a barrier metal liner in said trenches and via holes, depositing a metal layer to fill said trenches and via holes, and planarizing said metal layer.

14. The method of claim 12 wherein said etch stop layer is preferably comprised of silicon nitride, silicon oxynitride, or silicon carbide.

15. The method of claim 12 wherein said dielectric layer is selected from a group including $SiO_2$, carbon doped $SiO_2$, fluorosilicate glass, polysilsesquioxanes, polyarylethers, polyimides, and other low k dielectric materials.

16. The method of claim 12 wherein said first photoresist layer is a positive tone composition that includes a Novolac resin and a diazonaphthoquinone photoactive compound.

17. The method of claim 16 wherein said photoresist layer is baked at a temperature slightly above the glass transition temperature of the layer, preferably between about 90° C. and about 130° C.

18. The method of claim 12 wherein said recessed photoresist layer is formed in said holes by exposing said first photoresist with an appropriate exposure dose and developing said photoresist.

19. The method of claim 18 wherein said first photoresist is exposed without a mask using one or more wavelengths in the range of about 300 nm to about 500 nm.

20. The method of claim 18 wherein the exposure is performed with a scanner or stepper tool that has alignment capability or with a flood exposure tool that does not have alignment capability.

21. The method of claim 12 wherein the depth of said recess in said holes is a distance that is from 0% to 30% of the total depth of the hole.

22. The method of claim 12 wherein a thermal treatment is used to harden said photoresist and comprises a baking step at about 250° C. for about 2 minutes.

23. The method of claim 12 wherein the second photoresist is a composition that is sensitive to one or more wavelengths in the range from about 10 nm to about 500 nm.

24. The method of claim 12 wherein the thickness variation in said second photoresist coating is less than about 50 Angstroms between high duty ratio regions and low duty ratio regions.

25. A method for forming a planar photoresist layer on a contact hole pattern in fabricating a metal-insulator-metal (MIM) capacitor comprising:

(a) providing a substrate with a dielectric layer formed thereon, said dielectric layer contains a contact hole pattern having holes in high and low duty ratio regions, (b) depositing a conformal metal layer on said dielectric layer and in said holes, (c) coating a first photoresist layer on said metal layer, said photoresist is baked at a temperature such that the photoresist reflows and fills said contact holes, (d) removing said photoresist from the surface of said metal layer and forming a recessed layer of said photoresist in said holes, (e) hardening said recessed photoresist layer, and (f) coating a second photoresist layer on said metal layer that forms a uniform thickness over holes in both high duty ratio regions and in low duty ratio regions.

26. The method of claim 25 further comprised of completing the MIM capacitor by etching back said second photoresist to form a recessed layer within said holes, etching back said metal layer to be about coplanar with said recessed first photoresist layer, removing said first photoresist layer, depositing an insulator layer, depositing a top electrode layer, and defining a top plate pattern.

27. The method of claim 25 wherein the dielectric layer is selected from a group including $SiO_2$, carbon doped $SiO_2$, fluorosilicate glass, polysilsesquioxanes, polyarylethers, polyimides, and other low k dielectric materials.

28. The method of claim 25 wherein the metal layer is preferably TiN or TiN/W.

29. The method of claim 25 wherein said first photoresist layer is a positive tone composition that includes a Novolac resin and a diazonaphthoquinone photoactive compound.

30. The method of claim 25 wherein said photoresist layer is baked at a temperature slightly above the glass transition temperature of the layer, preferably between about 90° C. and about 130° C.

31. The method of claim 25 wherein said recessed photoresist layer is formed in said holes by exposing said first photoresist with an appropriate exposure dose and developing said photoresist.

32. The method of claim 31 wherein said first photoresist is exposed without a mask using one or more wavelengths in the range of about 300 nm to about 500 nm.

33. The method of claim 31 wherein the exposure is performed with a scanner or stepper tool that has alignment capability or with a flood exposure tool that does not have alignment capability.

34. The method of claim 25 wherein the depth of said recess in said holes is a distance that is from about 0% to 30% of the total depth of the hole.

35. The method of claim 25 wherein said recessed photoresist is hardened by a thermal treatment comprises a baking step at about 250° C. for about 2 minutes.

36. The method of claim 25 wherein the second photoresist is a composition that has an etch rate similar to that of the hardened first photoresist layer.

37. The method of claim 25 wherein the thickness variation in said second photoresist coating is less than about 50 Angstroms between high duty ratio regions and low duty ratio regions.

38. The method of claim 25 wherein the second photoresist is a composition that is sensitive to one or more wavelengths in the range from about 10 nm to about 500 nm.

* * * * *

UNITED STATES PATENT AND TRADEMARK OFFICE
CERTIFICATE OF CORRECTION

PATENT NO.    : 6,645,851 B1
DATED         : November 11, 2003
INVENTOR(S)   : Chia-Tun Ho et al.

It is certified that error appears in the above-identified patent and that said Letters Patent is hereby corrected as shown below:

<u>Title page,</u>
Item [75], delete "Chia-Shiung Tsia, Hsin-Chu (TW)" and replace it with
-- Chia-Shiung Tsai, Hsin-Chu (TW) --.

Signed and Sealed this

Thirtieth Day of December, 2003

JAMES E. ROGAN
*Director of the United States Patent and Trademark Office*